United States Patent
Oosterlaken

(10) Patent No.: US 7,256,375 B2
(45) Date of Patent: Aug. 14, 2007

(54) SUSCEPTOR PLATE FOR HIGH TEMPERATURE HEAT TREATMENT

(75) Inventor: Theodorus Gerardus Maria Oosterlaken, Oudewater (NL)

(73) Assignee: ASM International N.V., Bilthoven (NL)

( * ) Notice: Subject to any disclaimer, the term of this patent is extended or adjusted under 35 U.S.C. 154(b) by 407 days.

(21) Appl. No.: 10/636,372

(22) Filed: Aug. 7, 2003

(65) Prior Publication Data

US 2004/0040632 A1   Mar. 4, 2004

Related U.S. Application Data

(60) Provisional application No. 60/407,842, filed on Aug. 30, 2002.

(51) Int. Cl.
*H05B 6/10* (2006.01)
(52) U.S. Cl. ..................................... 219/634
(58) Field of Classification Search ............... 219/634, 219/730, 759, 618, 620, 627, 633, 632; 118/724, 118/725
See application file for complete search history.

(56) References Cited

U.S. PATENT DOCUMENTS

| | | | |
|---|---|---|---|
| 3,210,455 A * | 10/1965 | Sedlatschek | 373/156 |
| 3,972,704 A * | 8/1976 | Loxley et al. | 65/157 |
| 4,322,592 A * | 3/1982 | Martin | 219/634 |
| 4,407,654 A | 10/1983 | Irwin | |
| 4,563,558 A * | 1/1986 | Rhemer et al. | 219/634 |
| 4,770,590 A | 9/1988 | Hugues et al. | |
| 4,900,214 A | 2/1990 | Ben | |
| 4,923,054 A | 5/1990 | Ohtani et al. | |
| 4,978,567 A * | 12/1990 | Miller | 428/157 |
| 5,162,047 A | 11/1992 | Wada et al. | |
| 5,192,371 A | 3/1993 | Shuto et al. | |
| 5,219,079 A | 6/1993 | Nakamura | |
| 5,310,339 A | 5/1994 | Ushikawa | |
| 5,316,472 A | 5/1994 | Niino et al. | |
| 5,334,257 A | 8/1994 | Nishi et al. | |
| 5,407,449 A | 4/1995 | Zinger | |
| 5,482,558 A | 1/1996 | Watanabe et al. | |
| 5,482,559 A | 1/1996 | Imai et al. | |
| 5,492,229 A | 2/1996 | Tanaka et al. | |

(Continued)

FOREIGN PATENT DOCUMENTS

EP   0 238 751 A2   9/1987

(Continued)

*Primary Examiner*—Daniel Robinson
(74) *Attorney, Agent, or Firm*—Knobbe, Martens, Olson & Bear, LLP

(57) ABSTRACT

Susceptor plates are provided for high temperature (e.g., greater than 1000° C.) batch processing of silicon wafers. The susceptor plates are designed to accommodate one wafer each, and a plurality of loaded susceptor plates are vertically spaced apart in a susceptor plate holder during batch or furnace processing. The susceptor plates provide "full" support beneath the wafers, with openings of at most 20 mm in diameter in the support surface. Protrusions are also kept to a minimum. The susceptor plates thus prevent the wafers from sagging beyond the point of plastic deformation. The support surface is also ground or polished to remove protrusions beyond a prescribed height. For a given treatment temperature, the susceptor plates permit higher ramp rates without wafer plastic deformation or sticking to the susceptor plate. In one embodiment, the susceptor plates are pre-bent in a direction opposing the direction of sag.

30 Claims, 16 Drawing Sheets

U.S. PATENT DOCUMENTS

| | | | |
|---|---|---|---|
| 5,556,147 A | 9/1996 | Somekh et al. | |
| 5,556,275 A | 9/1996 | Sakata et al. | |
| 5,565,034 A | 10/1996 | Nanbu et al. | |
| 5,695,567 A * | 12/1997 | Kordina et al. | 118/725 |
| 5,820,367 A | 10/1998 | Osawa | |
| 5,858,103 A | 1/1999 | Nakajima et al. | |
| 5,865,321 A | 2/1999 | Tomanovich | |
| 5,879,462 A * | 3/1999 | Kordina et al. | 118/725 |
| 5,897,311 A | 4/1999 | Nishi | |
| 5,931,666 A | 8/1999 | Hengst | |
| 5,984,607 A | 11/1999 | Oosawa et al. | |
| 6,062,853 A | 5/2000 | Shimazu et al. | |
| 6,068,441 A | 5/2000 | Raaijmakers et al. | |
| 6,099,302 A | 8/2000 | Hong et al. | |
| 6,111,225 A | 8/2000 | Ohkase et al. | |
| 6,203,617 B1 | 3/2001 | Tanoue et al. | |
| 6,204,194 B1 | 3/2001 | Takagi | |
| 6,287,112 B1 | 9/2001 | Van Voorst Vader et al. | |
| 6,321,680 B2 | 11/2001 | Cook et al. | |
| 6,341,935 B1 | 1/2002 | Tseng | |
| 6,361,313 B1 | 3/2002 | Beyaert et al. | |
| 6,368,049 B1 | 4/2002 | Osaka et al. | |
| 6,390,753 B1 | 5/2002 | De Ridder | |
| 6,462,411 B1 | 10/2002 | Watanabe et al. | |
| 6,464,445 B2 | 10/2002 | Knapik et al. | |
| 6,896,738 B2 * | 5/2005 | Sumakeris et al. | 118/725 |
| 2002/0182892 A1 | 12/2002 | Arai et al. | |

FOREIGN PATENT DOCUMENTS

| | | |
|---|---|---|
| JP | 63102225 A | 5/1988 |
| JP | 10-321643 | 4/1998 |
| JP | 10-163297 | 6/1998 |
| JP | 02002033284 A | 1/2002 |
| WO | WO 00/68977 | 11/2000 |

\* cited by examiner

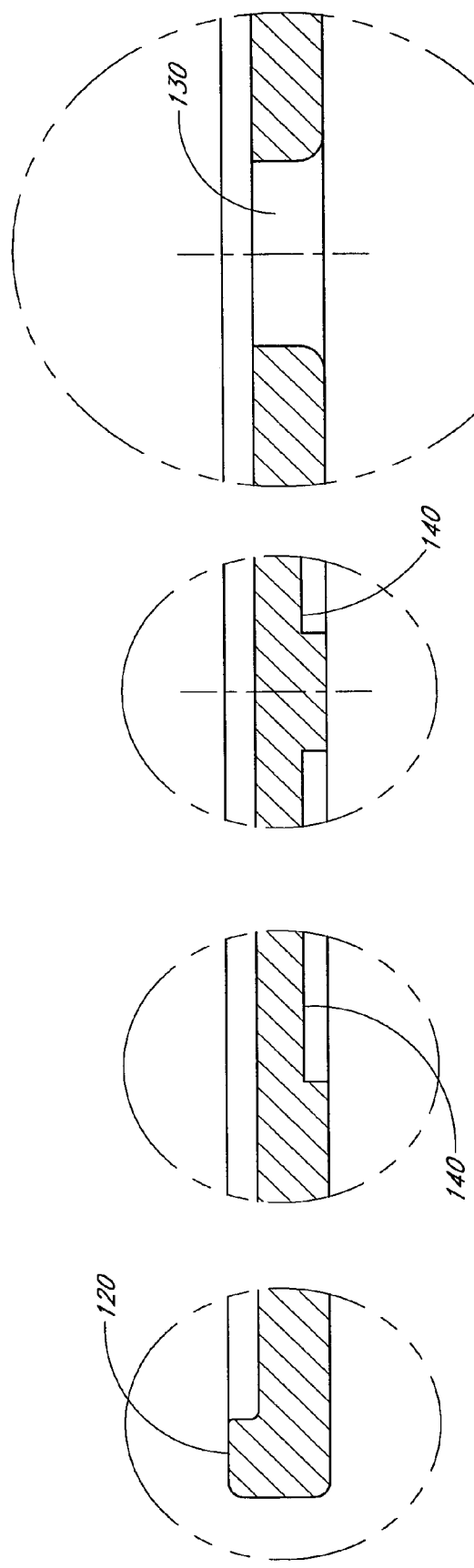
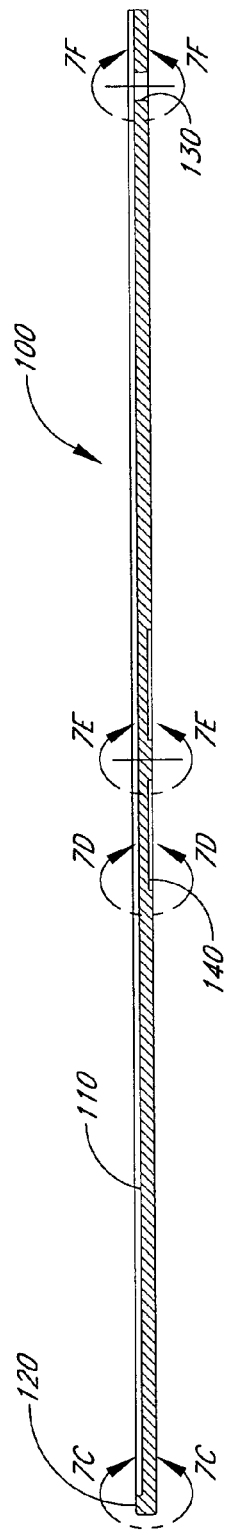
FIG. 7C  FIG. 7D  FIG. 7E  FIG. 7F
FIG. 7B

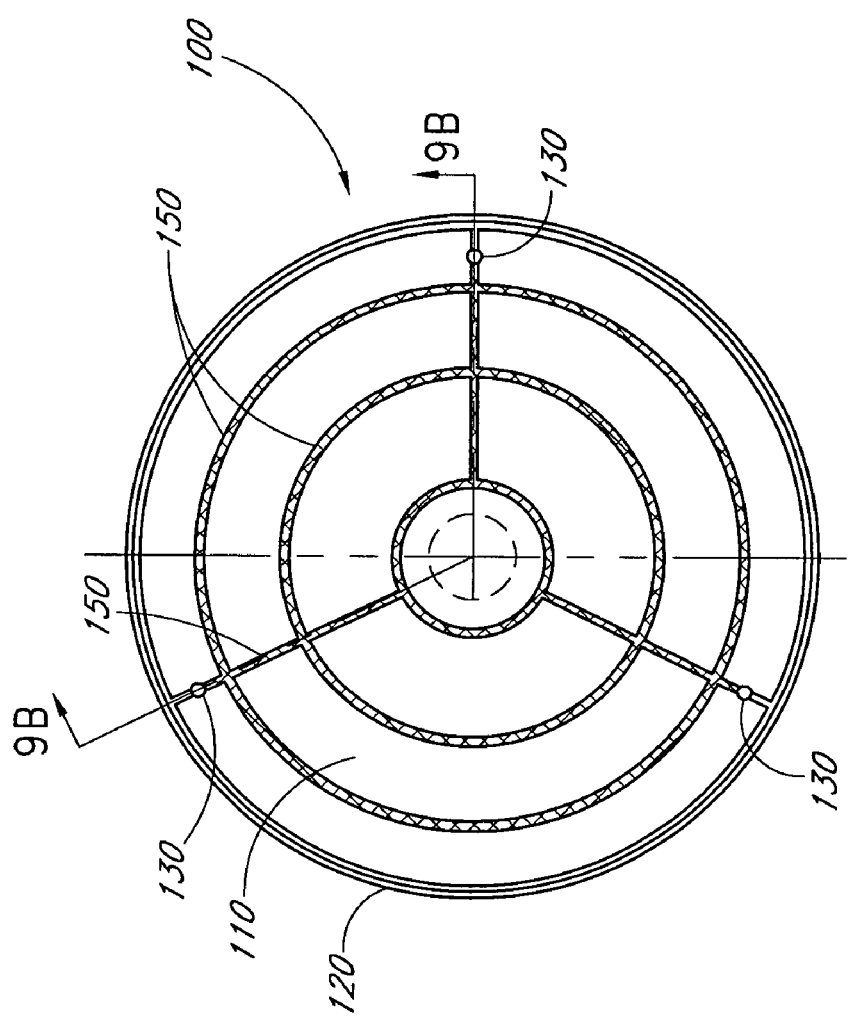

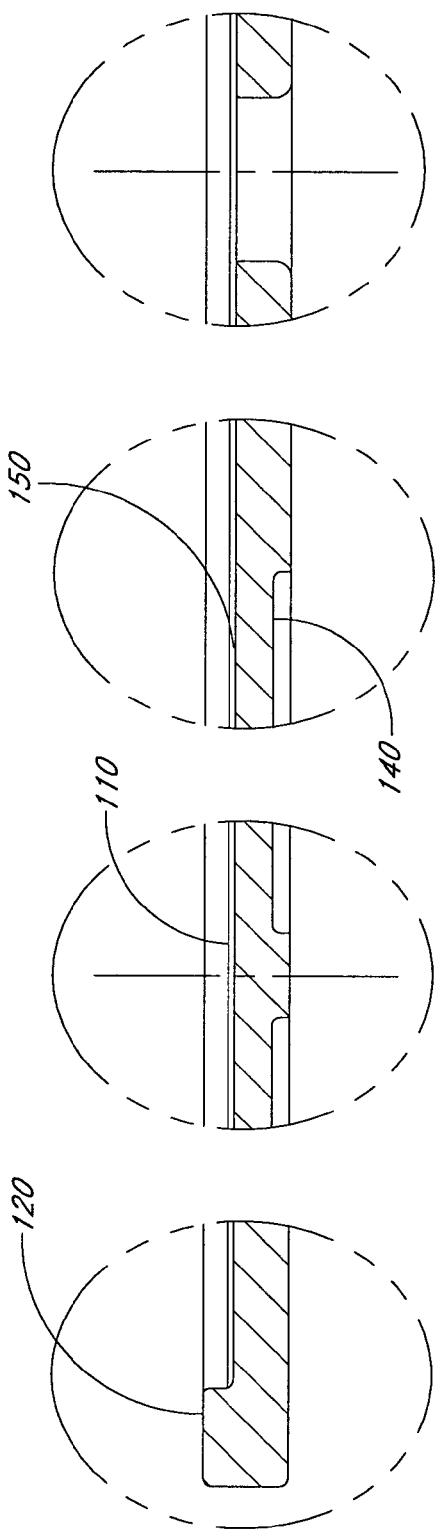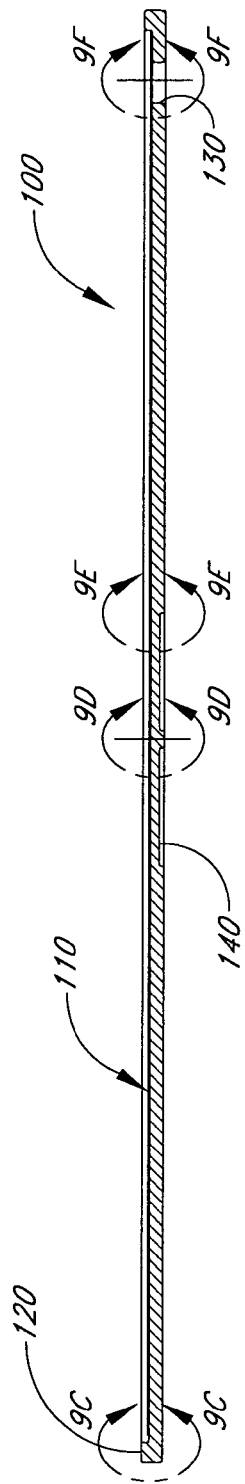

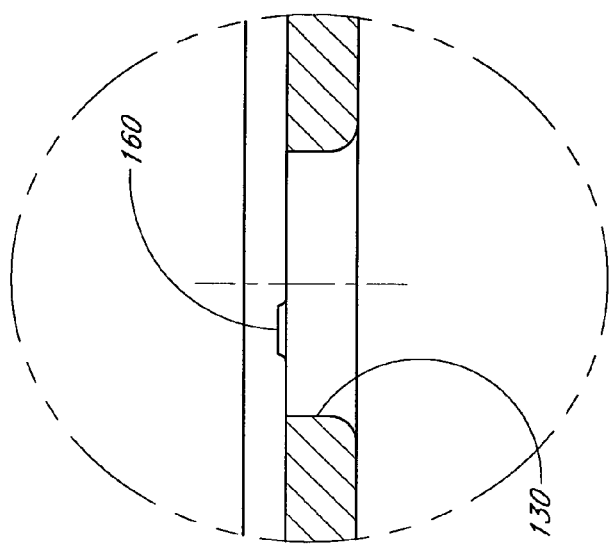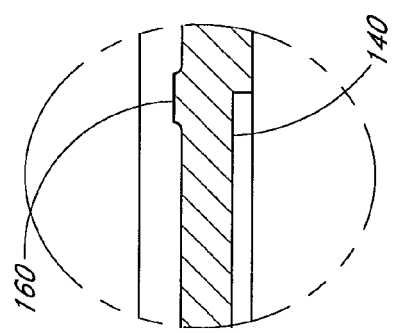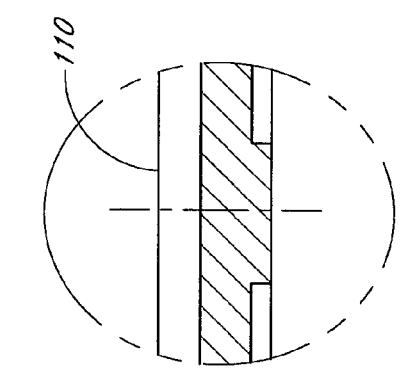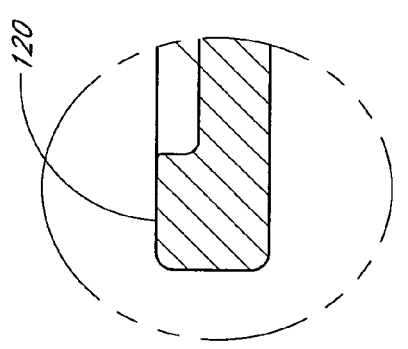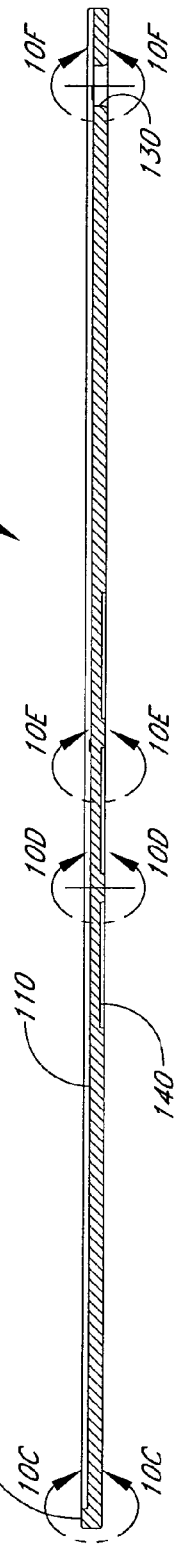
FIG. 10C    FIG. 10D    FIG. 10E    FIG. 10F
FIG. 10B

SUSCEPTOR PLATE FOR HIGH TEMPERATURE HEAT TREATMENT

REFERENCE TO RELATED APPLICATION

This application claims priority under 35 U.S.C. §119(e) to U.S. provisional application No. 60/407,842, filed Aug. 30, 2002.

This application is also related to U.S. provisional application No. 60/365,122, filed Mar. 15, 2002, entitled METHOD AND APPARATUS FOR HEAT TREATMENT OF A BATCH OF WAFERS AT HIGH TEMPERATURE and corresponding utility application Ser. No. 10/390,574, filed Mar. 13, 2003 and to U.S. Pat. No. 6,582,221, issued Jun. 24, 2003

FIELD OF THE INVENTION

The invention relates to the field of batch treatment of semiconductor wafers at high temperatures in a furnace.

BACKGROUND OF THE INVENTION

During processing of semiconductor wafers in a vertical furnace, a wafer boat accommodating a relatively large number of wafers in a horizontal orientation and a vertically spaced relationship is accommodated in the furnace. In a standard wafer boat the wafers are supported at three or more peripheral (wafer edge) positions. However, at high temperatures (e.g., >1000° C.) the yield strength of the wafers decreases and the wafers can sag under their own weight, they can deform as a result of thermally induced stresses or they can deform as a result of both effects. Wafers with large diameters are more susceptible to this effect than wafers with small diameters, as the thickness of the wafers does not increase proportionally with their diameter.

In U.S. Pat. No. 5,219,079 a wafer boat was proposed comprising susceptor plates to avoid warping of the wafers. The plates are each provided with a large recess to allow loading of a wafer onto each plate with a robot end effector, contacting the wafer at its lower surface. However, it was found that the relatively large recess resulted in local deformation of the wafer. Other boats with extended support area for the wafers are proposed in the art like ring type support boats. However, for high temperature processing of 300 mm wafers, the proposed supports are not adequate and still give rise to plastic deformation of the wafers.

In separate efforts, JP 63102225 suggests a wafer boat comprising susceptor plates that supports the wafers over their entire lower surfaces. This boat is used to keep reactive gas turbulence away from the wafer, thus improving the uniformity of a film deposited by CVD on each wafer. Wafers need to be loaded manually onto the susceptor plates. This is not acceptable in present-day processing, where the manual handling of 300 mm wafers is not a workable option.

It is therefore an object of the present invention to provide a method and device for heat treating 300 mm wafers at temperatures above 1000° C. wherein the wafers are handled automatically and the occurrence of plastic deformation of the wafers is minimized or eliminated.

SUMMARY OF THE INVENTION

According to the preferred embodiments of the present invention, during processing the wafers are accommodated in a vertically spaced apart relationship in a wafer boat, wherein the wafers are supported over substantially their entire lower surface area by susceptor plates. If accommodated in the wafer boat and loaded with a 300 mm wafer, the susceptor plate has an overall flatness that is within particular limits to minimize slip of the wafer during processing.

In the illustrated embodiment, to facilitate automatic loading of the wafers onto the susceptor plates, the plates are preferably provided with three or more holes with a diameter of not more than 20 mm. Protrusions on the support surface of the susceptor plate preferably have a height of no more than 0.7 µm. more preferably less than 0.5 µm in height. even more preferably less than 0.25 µm. yet even more preferably less than 0.15 µm in height, and most preferably, the protrusions have a height of no more than about 0.10 µm to avoid local occurrence of slip.

In a related application, U.S. provisional application No. 60/365,122 and corresponding U.S. regular application Ser. No. 10/390,574, a method and apparatus is provided for automatically loading wafers onto susceptor plates. The disclosure of these applications is expressly incorporated herein by reference.

BRIEF DESCRIPTION OF THE DRAWINGS

FIG. 7B is a cross-sectional side view of the susceptor plate of FIG. 7A;

FIGS. 7C–7F are enlarged cross-sections taken from various locations along the width of the susceptor plate of FIG. 7B;

FIG. 9A is a plan view showing a susceptor plate constructed in accordance with a second embodiment of the present invention;

FIG. 9B is a cross-sectional side view of the susceptor plate of FIG. 9A;

FIGS. 9C–9F are enlarged cross-sections taken from various locations along the width of the susceptor plate of FIG. 9B;

FIG. 10B is a cross-sectional side view of the susceptor plate of FIG. 10A;

FIGS. 10C–10F are enlarged cross-sections taken from various locations along the width of the susceptor plate of FIG. 10B;

DETAILED DESCRIPTION OF THE PREFERRED EMBODIMENT

It has been found that for the prevention of crystallographic slip during high temperature processing of silicon wafers in a vertical furnace, the wafer should be supported over substantially its entire surface area. This support is provided by susceptor plates that are preferably removably accommodated in a susceptor plate holder. The susceptor plate holder is designed similar to a standard open wafer boat and therefore preferably comprises at least three vertical columns, wherein upper ends of the columns are attached to an upper plate and lower ends of the columns are attached to a lower plate, wherein each column has mutually spaced recesses to receive edges of susceptor plates so that the susceptor plates are vertically spaced apart and rest substantially horizontal in the holder. Note that use of the term "susceptor" herein does not imply that the plate must be configured to absorb radiant or inductive heat. Indeed, as will be understood by the skilled artisan, even if the susceptor plates described herein had no thermal effect upon a supported substrate, it could still be configured as described herein and achieve the advantages described herein.

In order to facilitate automatic loading of a wafer onto a susceptor plate and unloading of a wafer from a susceptor plate, each susceptor plate is preferably provided with a plurality of (e.g., three) through holes to allow passage of lifting pins from the lower side of the susceptor plate. The holes are preferably spaced apart and positioned such that a wafer supported on three lifting pins extending through the holes is supported in a stable way. The diameter of each hole is preferably no more than 20 mm to prevent occurrence of slip, and more preferably the diameter of the holes is no more than 10 mm.

Gravitational stress or thermal stress will result in deformation of the wafer. When the deformation is small, it is elastic. This means that when the stress is removed, the wafer will regain it original flat shape. However, when the stress in the wafer exceeds the yield stress, the wafer will plastically deform. This means that at least part of the deformation is permanent. On a microscopic scale, crystallographic slip occurs. The yield strength of a wafer depends on the temperature and decreases with increasing temperature. For this reason, high temperature treatments are very sensitive. The higher the temperature of the treatment, the less deformation of the wafer can be tolerated. Below, the limits of the allowed deformations are provided.

Figure 1:
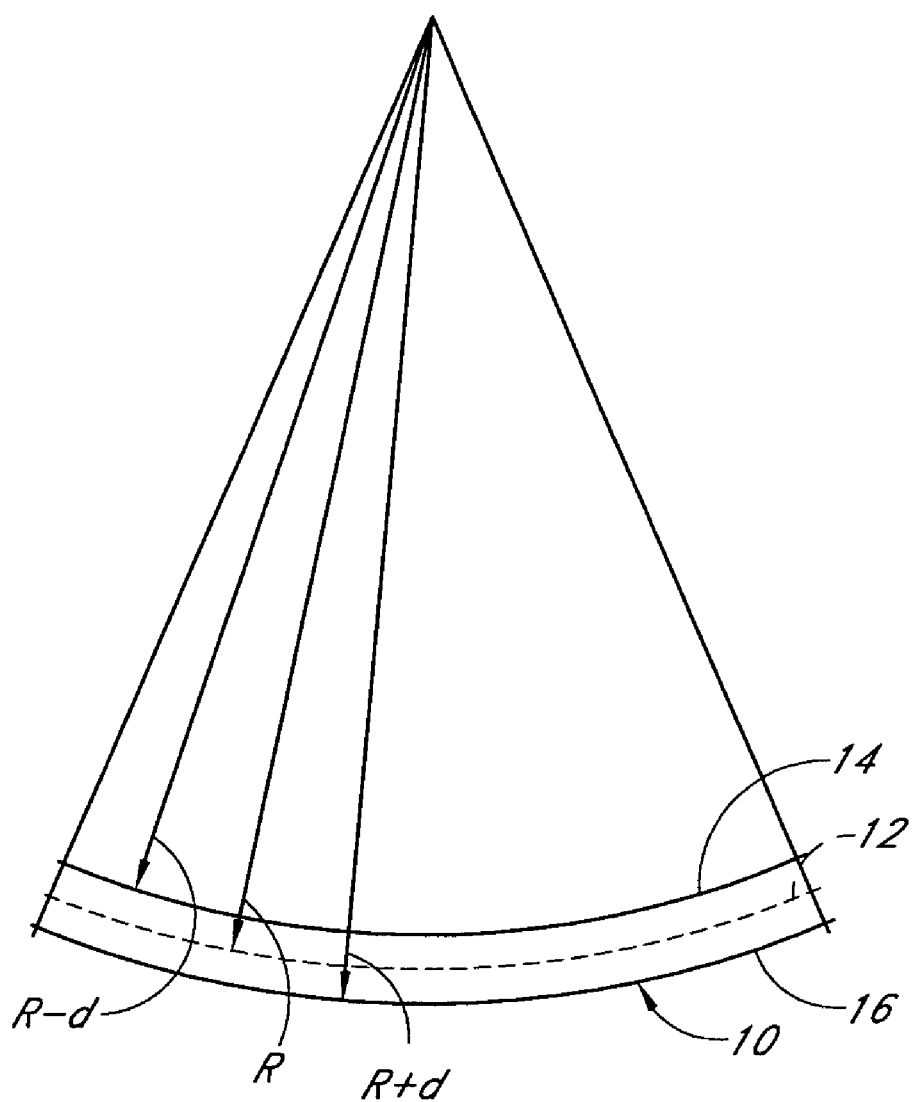
FIG. 1 schematically shows an object, such as a semiconductor wafer, in profile, bent or curved along a radius of curvature.

Consider a flat plate 10 that is slightly deformed so that it assumes a cylindrical shape (see FIG. 1, representing a side view of the plate 10). The central plane 12 (radius=R) of the plate 10 is neither lengthened nor shortened when the plate 10 is curved as shown, but the upper surface 14 (radius=R−d) is elongated by a fraction and the lower surface 16 (radius=R+d) is contracted by a fraction. The deformation $\epsilon_s$ is then given by $$\epsilon_s = \sigma_s \times (1-\nu)/E \tag{1}$$

wherein $\sigma_s$ is the yield strength of the material;

E is Young's modulus, defining the relation between stress and deformation in case of elastic deformation; and $\nu$ is Poisson's ratio.

For 1-0-0 or <100> mono-crystalline silicon at 1300° C., the following values are applicable:

$\sigma_s$=0.45 Mpa

E=130 Gpa $\nu$=0.28

Substituting these values in equation (1) gives:

$$\epsilon_s = 0.45 \times 10^6 \times (1-0.28)/(130 \times 10^9) = 2.5 \times 10^{-6} \tag{2}$$

We will now relate this strain to a radius of curvature. The contraction of the lower surface 16 is proportional to the decrease in radius when going from the central plane 12 to the lower plane 16. Similarly, the elongation of the upper plane 14 is proportional to the increase in radius when going from the central plane 12 to the upper plane 14. It is assumed that the thickness of the plate 10 is 2 d. The stress at both the upper surface 14 and the lower surface 16 should be smaller than the yield stress. Assuming the stress to be equal to the yield stress gives the equation:

$$\frac{(R-d)}{(1-\epsilon_s)} = \frac{R}{1} = \frac{(R+d)}{(1+\epsilon_s)} \tag{3}$$

resulting in:

$$R = d/\epsilon_s \tag{4}$$

Substituting d=380×10⁻⁶ m, representing half the thickness of a standard silicon wafer, results in:

R=152 m

Figure 2:
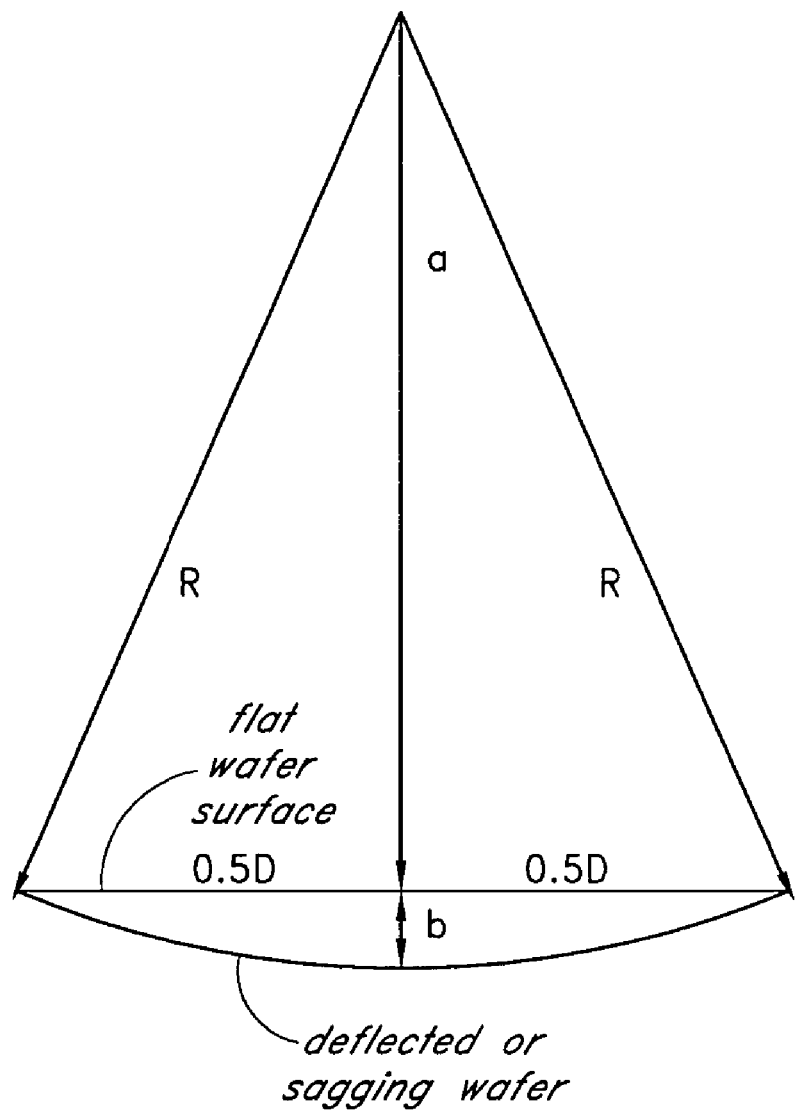
FIG. 2 shows the deflection of a bent object.

This is the radius of curvature of the wafer at which plastic deformation starts to occur at a treatment temperature of 1300° C. We can also correlate the radius of curvature to a deflection of the wafer (see FIG. 2). The deflection b relates to the radius of curvature R and the wafer diameter D as follows:

$$b = R - a = R - [R^2 - (0.5D)^2]^{0.5} \tag{5}$$

$$b = 152 - [152^2 - (150 \times 10^{-3})^2]^{0.5} = 74 \times 10^{-6} m \tag{6}$$

In the same way the maximum allowed radius of curvature of the wafer for other treatment temperatures can be calculated and is shown in Table I below.

TABLE I

| Temperature (° C.) | Yield Strength $\sigma_s$ (Mpa) | Radius of curv. R (m) | Deflection b (μm) |
|---|---|---|---|
| 1300 | 0.45 | 152 | 74 |
| 1200 | 0.75 | 91 | 123 |
| 1100 | 1.2 | 57 | 197 |
| 1000 | 2.0 | 34 | 328 |

Table I provides the strength of silicon for different temperatures and the radius of curvature or deflection at which plastic deformation of a 300 mm silicon wafer starts. As is apparent from Table I, the acceptable wafer deflection due to sagging (which is controlled by design of the susceptor plate deflection) depends on the temperature of treatment. If the treatment temperature is less than or equal to about 1000° C., allowable deflection is preferably less than 328 µm; at less than or equal to about 1100° C., allowable deflection is preferably less than 200 µm; at less than or equal to about 1200° C., deflection is preferably less than 125 µm; and at less than or equal to about 1300° C., deflection is preferably less than 75 µm.

When during treatment of a wafer at a treatment temperature, the deflection of a wafer supported on a susceptor plate that is held in the susceptor plate holder is less than the values as defined by Table I, or when its radius of curvature is larger than the value defined by Table I, no plastic deformation will occur. It will be clear that for intermediate values of the treatment temperature, intermediate values of the deflection, and the radius of curvature will be applicable. In a first approximation, the skilled artisan can apply linear interpolation between the given values.

In addition to the mechanical stress in the wafer due to its bending, thermally induced stress can occur due to temperature gradients over the wafer. The limits for allowable deflection as given in Table I assume that the thermally induced stress is zero, which is in reality not the case. Therefore, it will be advantageous if the wafers, when supported on the susceptor plates during processing, have a flatness better (i.e., lower radius of curvature) than the flatness as specified in Table I. The flatter the wafer, the larger the allowable temperature ramp-up or ramp down rate without inducing slip. As an example, some values for ramp rates used in conjunction with a susceptor plate with a deflection of less than 25 µm are given in Table II, the combination resulting in slip free wafers. While only exemplary and not representing maximum values, it will be understood in view of the present disclosure that, for the given temperature ranges, lower ramp rates than the exemplary rates in Table II can be employed without slip.

TABLE II

| Temperature range (° C.) | Ramp rate (° C./min) |
| --- | --- |
| 1300–1250 | 0.28 |
| 1250–1200 | 0.35 |
| 1200–1150 | 0.46 |
| 1150–1100 | 0.62 |
| 1100–1050 | 0.85 |
| 1050–1000 | 1.2 |

The ramp rates of Table II were successfully applied in conjunction with a susceptor holder having a wafer pitch of 21.6 mm. To the artisan it will be apparent in view of the present disclosure that the rate of temperature change and the wafer/plate pitch are not independent, and by allowing a larger pitch the rate at which temperatures can be changed can be increased. This behavior is similar to the heating of wafers without plates in a stack, which is described by S. K. Griffiths, R. H. Nilson, R. Foote, and K. Torres at the Wafer Defect Science & Engineering Topical Conference on Larger Diameter Wafer and Thermal Stress Issues, Austin, Tex., Sep. 27, 1995.

By providing "full" support beneath the wafer with a susceptor having the flatness required of a wafer to avoid plastic deformation, a supported wafer is prevented from deflecting to the same extent when processing at very high (greater than 1000° C.) temperatures.

Figure 3:
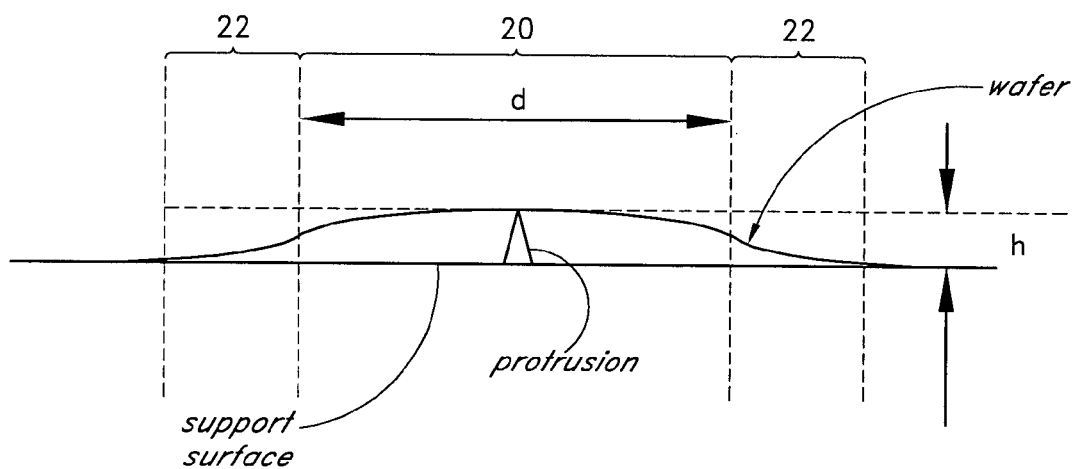
FIG. 3 shows a protrusion on a flat surface and its effect upon an object supported thereon.

Although the support surface of a susceptor plate can have an overall flatness that is generally within the limits to minimize plastic deformation of a silicon wafer supported on it, another effect can be detrimental. The occurrence of incidental protrusions on the support surface can give rise to local slip. A protrusion on the susceptor plate surface and its effect is schematically shown in FIG. 3. The wafer will be lifted up by the protrusion, so that it is not otherwise supported over a certain circular area. It has been found that holes in the susceptor plate with a diameter of 20 mm are acceptable and do not give rise to the occurrence of slip. For larger diameters, slip tends to occur. Therefore the unsupported area can have a maximum diameter of 20 mm. Alternatively, holes in the plate can have a different shape than purely circular. In that case the opening should be dimensioned such that the maximum diameter of a circular opening that can be accommodated within the actual opening has a diameter of 20 mm. For example, a rectangular opening of 10×40 mm is acceptable, since a circle of 20 mm diameter will not fit therein. Similarly, grooves or grid patterns (see FIGS. 9 and 10) are acceptable as long as the depressions from the support surface (i.e., valleys or grooves) cannot accommodate a circle of 20 mm.

For the wafer shown in FIG. 3, it is assumed that in the central convex area 20 the wafer is a circular shape with a maximum allowable radius of curvature and that in the concave outer area 22, the wafer is also bent into to a circular shape with the same radius of curvature but in opposite direction. The central convex 20 part will occupy an area with a radius r that is roughly half the diameter d of the total unsupported area. Assuming a maximum diameter for the unsupported area of 20 mm or $20 \times 10^{-3}$ m, this results in $r = 5.0 \times 10^{-3}$ m. We can now use a formula similar to formula (5) to calculate the maximum allowable protrusion height:

$$0.5 \times h = R - [R^2 - r^2]^{0.5} \quad (7)$$

Substituting the r value above and the R values from Table I, the results as presented in Table III are obtained.

TABLE III

| Temperature (° C.) | Radius of curv. R (m) | Protrusion height (µm) |
| --- | --- | --- |
| 1300 | 152 | 0.16 |
| 1200 | 106 | 0.27 |
| 1100 | 58 | 0.44 |
| 1000 | 28 | 0.73 |

Table III provides the allowable height of protrusions within a range of 20 mm. As is apparent from Table III, the acceptable protrusion height depends on the temperature of treatment. If treatment temperature is less than or equal to about 1000° C., any protrusions on the wafer-supporting surface are preferably less than 75 µm in height; at less than or equal to about 1100° C., protrusions are preferably less than 0.5 µm in height; at less than or equal to about 1200° C., protrusions are preferably less than 0.25 µm; and at less than or equal to about 1300° C., protrusions are preferably less than 0.15 µm in height. Most preferably, the support surface is ground or polished to remove any protrusions higher than about 0.10 µm.

In order to remove inherent protrusions on the surface of the susceptor plate, it should be grounded and/or polished. Preferably, polishing and grinding treatment should be continued at least until the specification according Table III has been achieved.

Although protrusions are not tolerable, pits, recesses, even through holes are allowable, as long as their dimension does not exceed a diameter of 20 mm or, when differently shaped, does not leave unsupported a circular region of the wafer having a diameter larger than 20 mm.

The flatness specifications in Table I hold true for a wafer when supported on a susceptor plate in a holder at the treatment temperature. However, the susceptor plate itself, being only supported at its edges in the susceptor plate holder, can also sag due to its own weight and due to the additional weight of the silicon wafer. When a sufficiently thick susceptor plate of a refractory material is taken, the sagging of the susceptor plate is insignificant. As an example, a CVD SiC susceptor plate for a 300 mm silicon wafer, the susceptor plate having a thickness of 2 mm, is calculated to sag with a deflection of 25 µm, which is well within the allowable limits. For thinner susceptor plates, the sagging of the susceptor plate needs to be taken into account. Care has to be taken that, after loading the susceptor plate with the silicon wafer, the overall flatness requirement is met.

Figure 4:
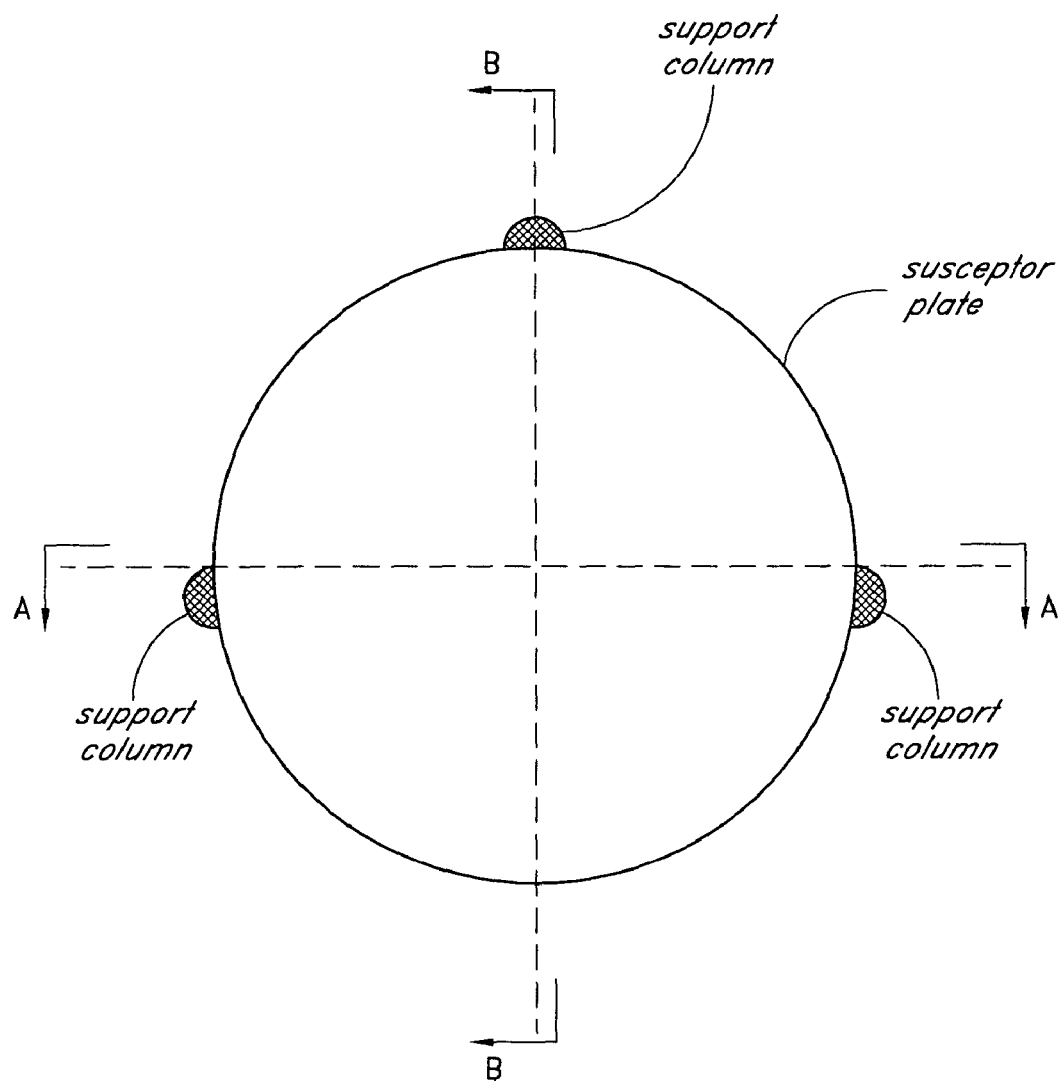
FIG. 4 shows three point support of a susceptor plate in a susceptor plate holder.

The possible sagging of susceptor plates is illustrated in FIGS. 4, 5 and 6. In FIG. 4, the situation is assumed of a susceptor plate holder supporting the susceptor plate at three positions along the edge. Due to the asymmetry of support, sagging in direction A—A will be different compared to the sagging in direction B—B.

Figure 5A:
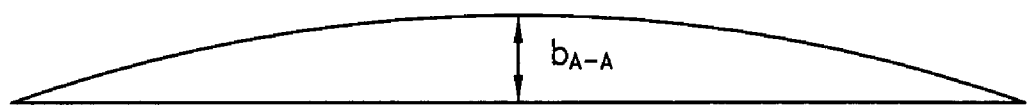
FIG. 5A is a schematic side view taken along lines A—A of FIG. 4, showing a pre-bent susceptor plate in an unloaded condition.
Figure 5B:
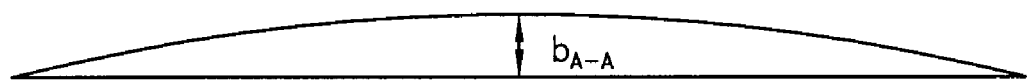
FIG. 5B is a schematic side view taken along lines A—A of FIG. 4, showing a pre-bent susceptor plate when accommodated in the susceptor plate holder of FIG. 4, therefore reducing the pre-bent shape due to sagging under its own weight.

According to an embodiment of the present invention, the susceptor plates are pre-bent in a sense opposite to the bending expected to occur when a susceptor plate is placed in the susceptor plate holder and when a wafer is loaded onto the susceptor plate. As an example, take a CVD SiC plate of 300 mm diameter and 0.7 mm thickness. In the direction A—A, the susceptor plate is pre-bent with a convex-up radius of curvature, corresponding with a deflection of $b_{A-A}$=150 µm, as shown in FIG. 5A. After placing the susceptor plate in the susceptor plate holder, it will sag under its own weight so that the deflection decreases to $b^{A-A}$=50 µm as shown in FIG. 5B. After loading the wafer on the susceptor plate (not shown), the deflection is less than 25 µm.

Figure 6A:
FIG. 6A is a schematic side view showing the bending along lines B—B in FIG. 4 of a pre-bent susceptor plate in an unloaded condition.
Figure 6B:
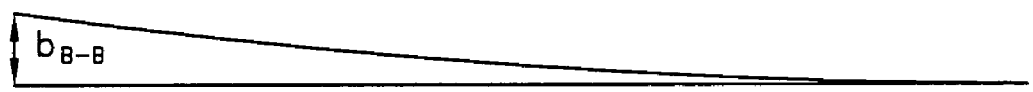
FIG. 6B shows the bending along lines B—B in FIG. 4 of a pre-bent susceptor plate when accommodated in the susceptor plate holder of FIG. 7, therefore reducing the pre-bent shape due to sagging under its own weight.
Figure 7A:
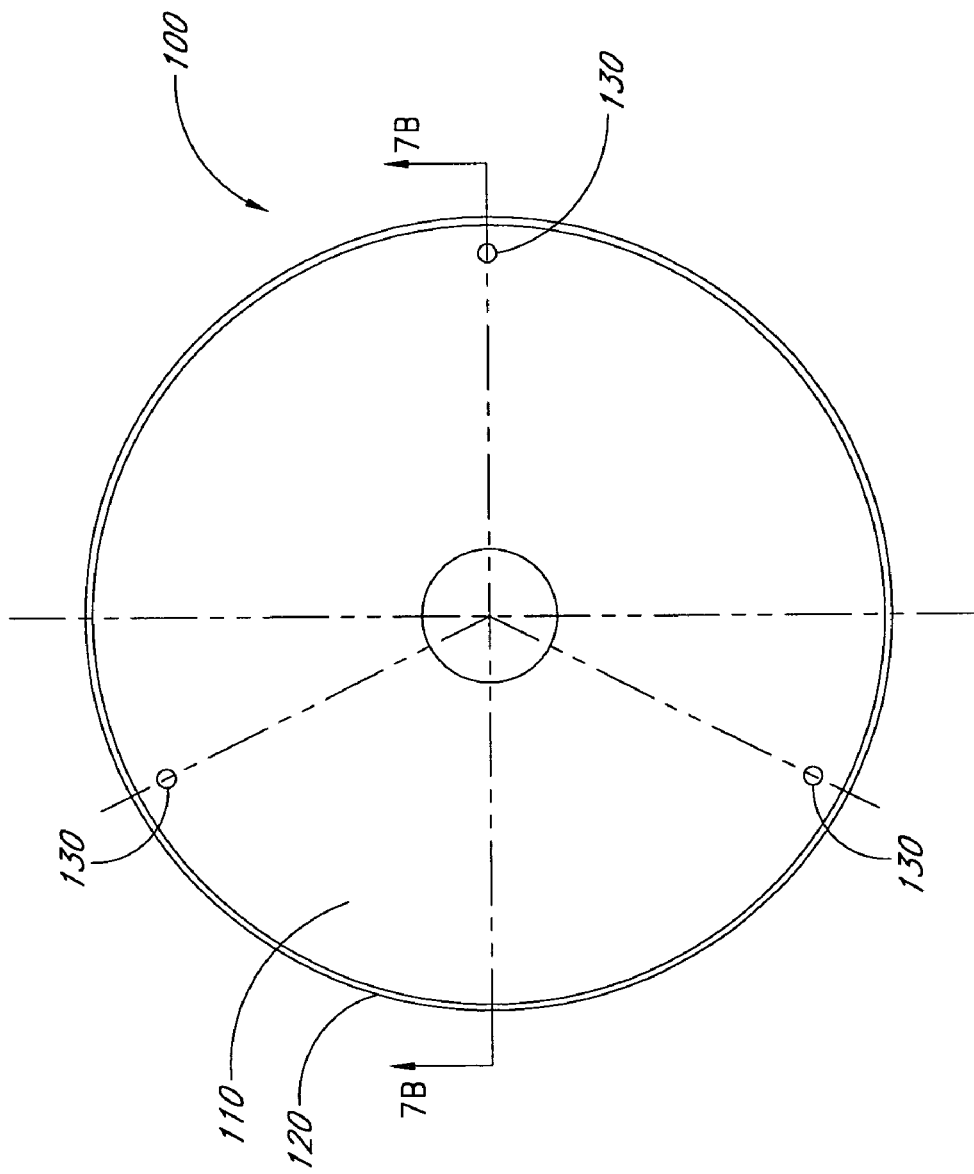
FIG. 7A is a plan view showing a susceptor plate constructed in accordance with a first embodiment of the present invention.

For the direction B—B the deflection of the susceptor plate $b_{B-B}$=500 µm, as shown in FIG. 6A. After loading the susceptor plate in the susceptor plate holder, the deflection $b_{B-B}$=150 µm, as shown in FIG. 6B. Again, after loading the silicon wafer on the susceptor plate (not shown), the deflection is insignificant.

As a contact material with the silicon wafer, CVD SiC appears to be a suitable material that has not demonstrated sticking of a silicon wafer at a temperature of 1300° C. The CVD SiC can be deposited on sintered SiC material, in a sufficient thickness to seal the sintered SiC material adequately. More preferably, the susceptor plates are made of so-called "free-standing" CVD SiC. This is a SiC coating, initially deposited on a support material but with a thickness that is sufficient to allow removal of the support material (e.g., graphite), in a process analogous to a "lost wax" method of transferring molds. See U.S. Pat. No. 4,978,567, issued Dec. 18, 1990 to Miller, the disclosure of which is incorporated herein by reference. When the designed shape of the susceptor plate requires machining, the machining can be performed in reverse, i.e., on the support material before deposition of the CVD SiC coating, so that machining of the hard CVD SiC material can be omitted or reduced to a minimum. Alternatively, the CVD SiC can be deposited on a flat support material and the CVD SiC can be machined according to requirements. In either case, the support surface of the susceptor plate should be subjected to a grinding and/or polishing treatment after deposition of the SiC material in order to remove any protrusions present on it.

As is known in the art, the CVD SiC coated susceptor plate is preferably subjected to an oxidation treatment in order to minimize sticking of the silicon wafer to the SiC coating during the high temperature processing.

Figure 8:
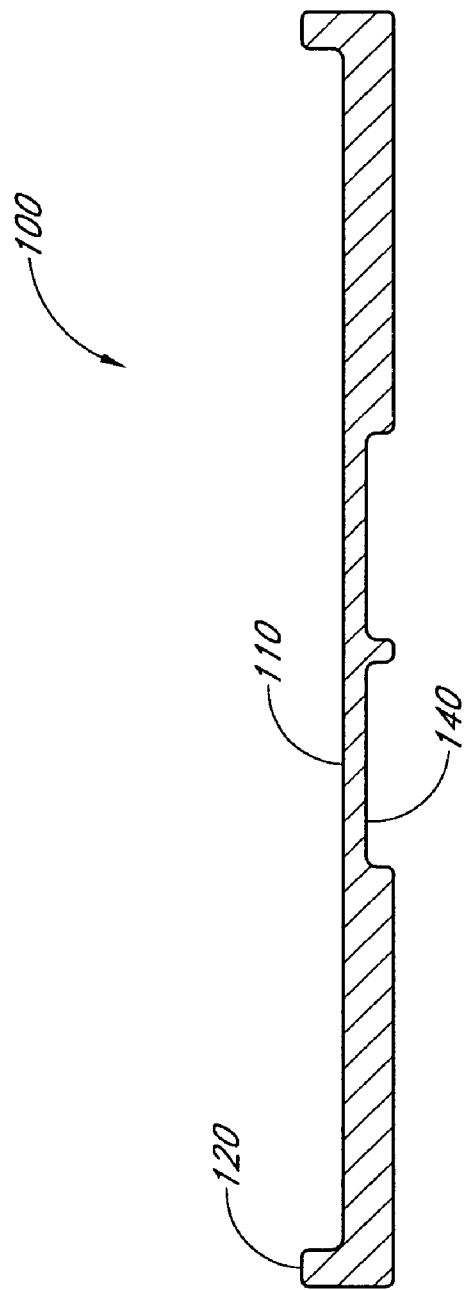
FIG. 8 is a schematic cross-section (not to scale) of the susceptor plate of FIG. 7.

A first example of a susceptor plate 100 is shown in FIGS. 7A–7F and 8. The susceptor plate 100 has a diameter slightly larger than the wafer diameter. The support surface 110 for supporting a wafer thereon is substantially flat. At the circumference the susceptor plate 100 is provided with a raised shoulder or edge 120. During heat-up, the raised edge 120 shields the wafer edge against excessive heat radiation during heat-up, avoiding overheating of the wafer edge. During cool-down, the raised edge 120 shields the wafer from cooling too rapidly. Furthermore, the raised edge 120 prevents the wafer from moving horizontally during transport of the susceptor plate 100 with a wafer thereon. The susceptor plate 100 is provided with three through holes 130 to facilitate automatic loading. The holes 130 are somewhat oval with a minimum dimension in a first direction of about 5 mm and a maximum dimension in a second direction, perpendicular to the first direction, of about 6 mm. FIG. 8 is a schematic cross-section of the susceptor plate 100, not drawn to scale, wherein the dimensions perpendicular to the support surface are enlarged for clarification. For the present purposes, the shaping of the lower surface of the susceptor plate 100 is not critical. The function of the recess 140 in the center is explained in further detail in related provisional U.S. provisional application No. 60/377,904, filed May 2, 2002, entitled TWO-LEVEL END EFFECTOR and corresponding utility application Ser. No. 10/361,480, filed Feb. 5, 2003, the disclosures of which are incorporated herein by reference.

A second example of a susceptor plate 100 is shown in FIGS. 9A–9F. Like parts are indicated with similar reference numerals as in FIG. 7. In this example, the support surface 110 is provided with grooves 150. The grooves are 5 mm wide and 0.2 mm deep. The grooves 150 facilitate the escape of air between a wafer and the susceptor plate 100 when the susceptor plate 100 is moved towards the wafer or vice versa so that the wafer is supported on the susceptor plate 100. More importantly, the grooves 150 facilitate the admission of air between the wafer and the susceptor plate 100 when, after processing, the wafer is being separated from the susceptor plate 100. As shown in FIG. 9A, it is very effective to position the lift pin holes 130 within the grooves 150. The flatness requirement for the support surface 110 is still applicable to this susceptor plate. As with the holes, it will be apparent to the skilled artisan in view of the present disclosure that the grooves are not part of the support surface, as long as the grooves are of minimal dimensions.

Figure 10A:
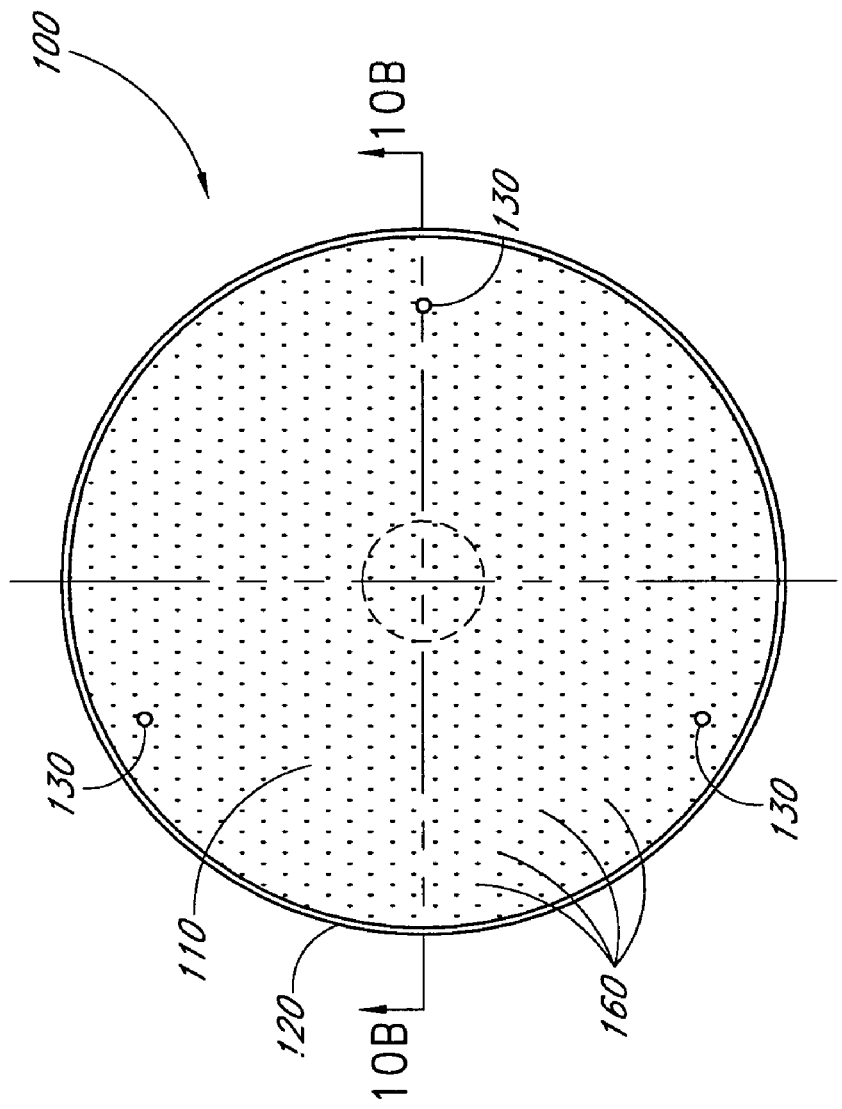
FIG. 10A is a plan view showing a susceptor plate constructed in accordance with a third embodiment of the present invention.

A third example of a susceptor plate is shown in FIG. 10. Like parts are indicated with similar reference numerals as in FIG. 7. The support surface 110 in this example comprises raised pedestals 160. The distance between neighboring pedestals 160 is 7 mm. The dimensions of the pedestals are 1×1 mm and a height of 0.2 mm. The support surface now consists of the top surfaces of the combined pedestals and the flatness requirement is applicable to this discontinuous top surface. It was found that a dimension of 0.1×0.1 mm of the pedestals provides sufficient support area to avoid damage to the wafer due to stress concentrations, as long as the pedestals are not excessively spaced apart. As will be understood by someone skilled in the art, the support surface of the pedestal is described as a square for convenience, but it does not need to be square; it may be rectangular, circular or may have any other convenient shape.

Figure 11:
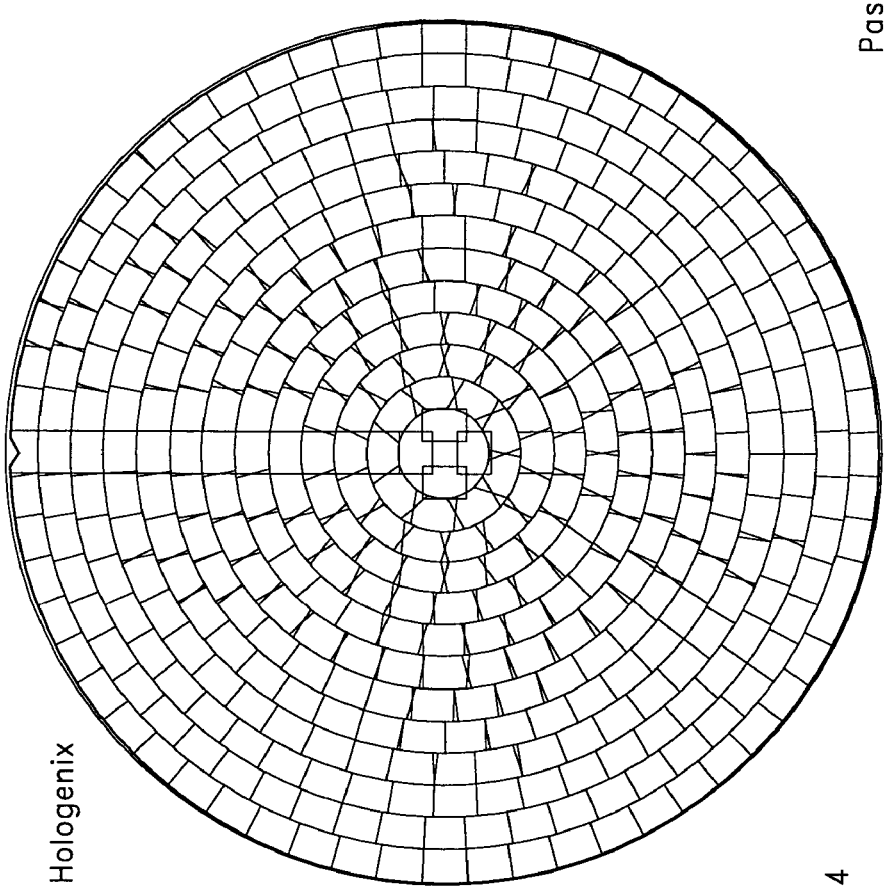
FIG. 11 is a Hologenix™ sector map of a wafer processed at 1320° C. on a susceptor plate at an intermediate position within a wafer load, showing no slip.
Figure 12:
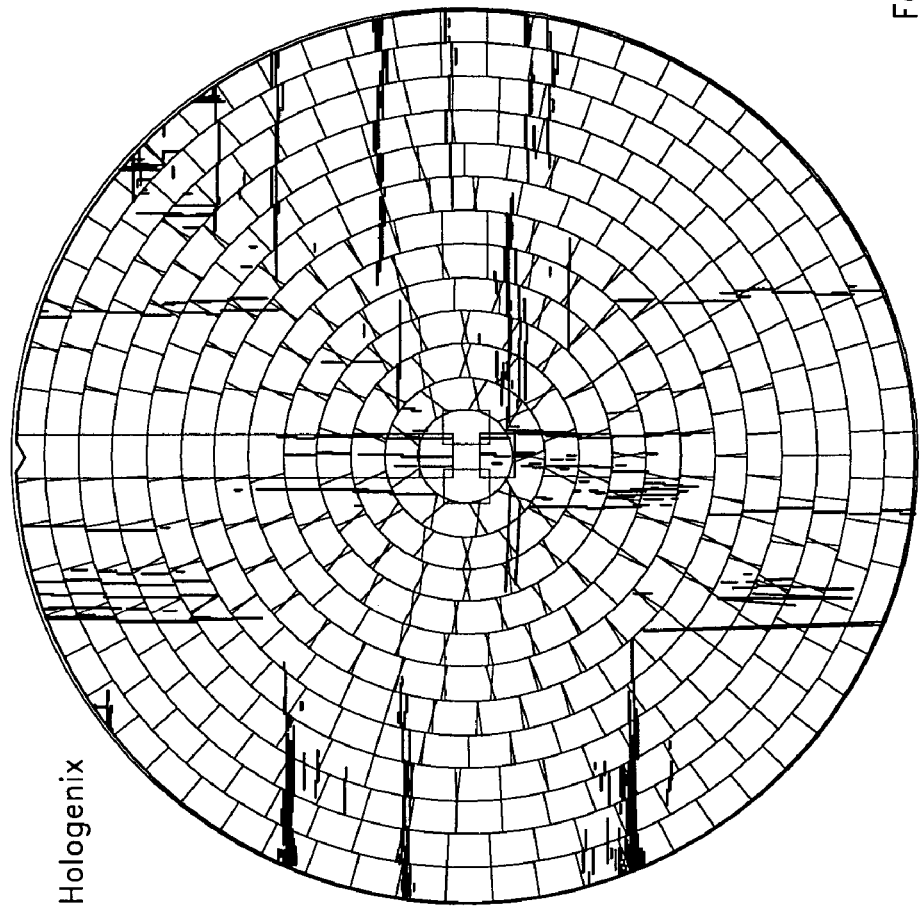
FIG. 12 is a Hologenix™ sector map of a wafer processed at 1320° C. on a susceptor plate at an end position of a wafer load, showing severe slip.

Slip-free processing of silicon wafers by the use of the susceptor plates as described herein was confirmed by measurements with a Hologenix™ surface optical reflection apparatus, commercially available from Hologenix, Inc of 15301 Connector Lane, Huntington Beach, Calif. In FIG. 11, a Hologenix™ sector map is shown for a P-wafer processed on a susceptor plate at an intermediate position in a wafer load. The processing temperature was 1320° C. and the wafer pitch was 21.6 mm. It can be observed that all sectors of the map are slip free. In FIG. 12, a Hologenix™ sector map is shown for a P-wafer processed on a susceptor plate at one of the extremities (e.g., at upper or lower slots of a vertical boat) of the wafer load. Many slip lines can be observed in the sector map of FIG. 12. The poor temperature uniformity at the load extremity causes thermally induced stresses resulting in slip lines. Apart from having different positions within the wafer load, the wafers of FIGS. 11 and 12 were processed under the same conditions, in the same process run. Slip patterns similar to the one shown in FIG. 12 were also obtained when the temperature ramp rate was too high.

Figure 13:
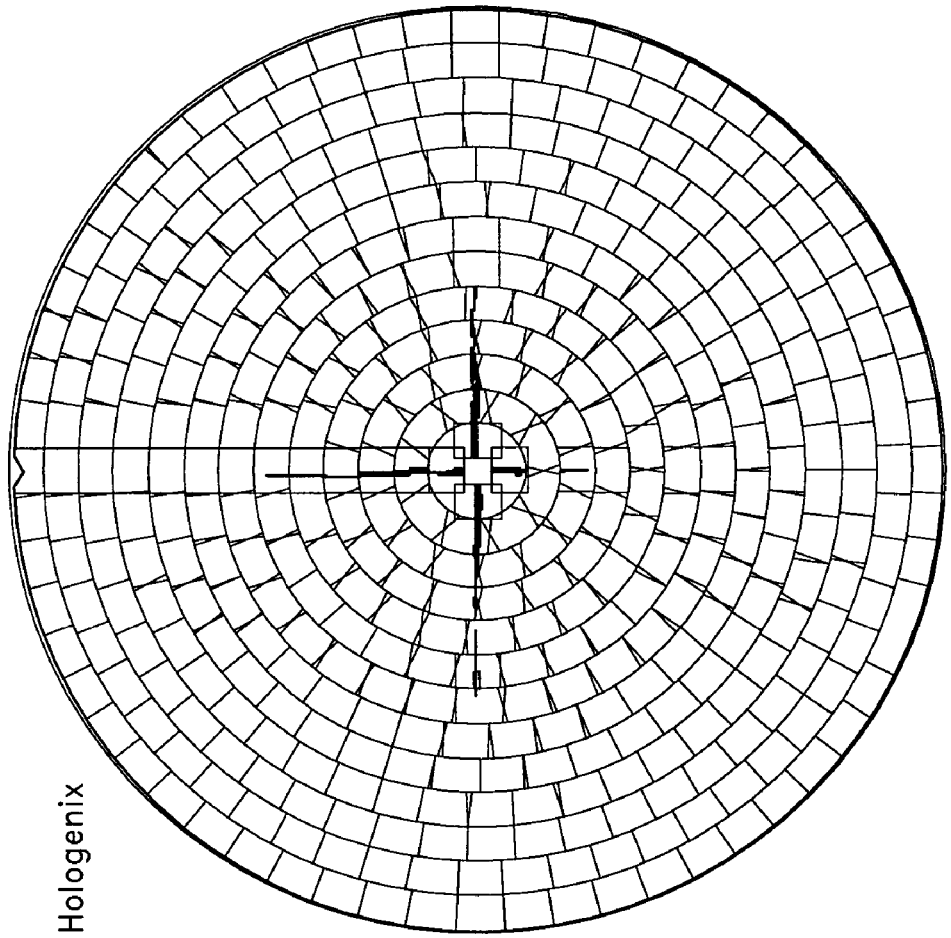
FIG. 13 is a Hologenix™ sector map of a wafer processed at 1320° C. on a susceptor plate having a protrusion in its center.
Figure 14:
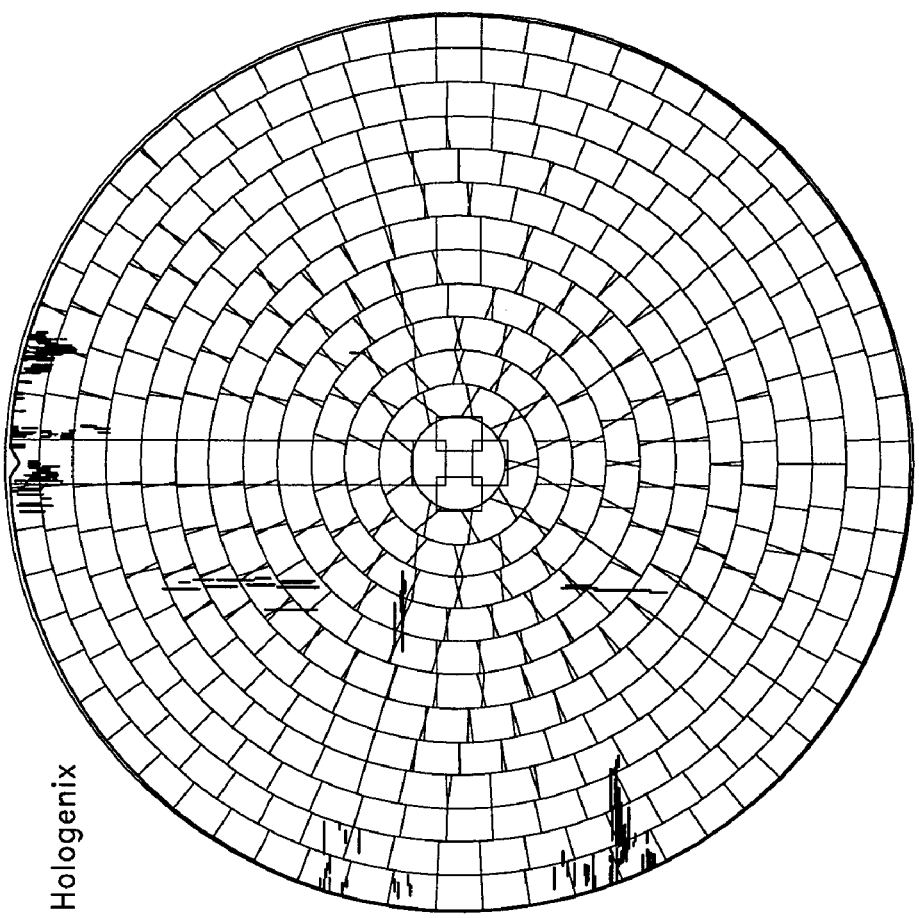
FIG. 14 is a Hologenix™ sector map of a wafer processed at 1320° C. on a susceptor plate comprising contamination on its bearing surface.

In FIG. 13, a Hologenix™ sector map is shown for a P⁻ wafer processed on a susceptor plate having a protrusion in its center that was larger that the allowable protrusions as specified herein. In FIG. 14, a Hologenix™ sector map is shown for a P⁻ wafer processed on a susceptor plate comprising contamination with particles on its bearing or supporting surface. It was found that during use, particle contamination can collect on the bearing surface of the susceptor plate, deteriorating the smoothness of the bearing surface. Regular cleaning of the susceptor plate ensures slip free processing of the silicon wafers. Cleaning can be performed by a nitrogen jet, dry $CO_2$, wet cleaning or by any other available cleaning technique in the art.

FIG. 11 demonstrates that the susceptor plate of the preferred embodiments of the present invention is capable of producing slip-free results at processing temperatures as high as 1320° C. We were not able to reproduce the slip-free results of FIG. 11 with wafer supports of prior art designs. FIG. 12 demonstrates that other conditions like temperature uniformity should also be within certain limits, confirming prior studies in the art. The Hologenix™ results were confirmed by XRD, which technique is capable of detecting slip lines not only at the surface of the wafer but also in the bulk of the wafer material.

It will be appreciated by those skilled in the art that various omissions, additions and modifications may be made to the processes described above without departing from the scope of the invention. For example, the transshipment station described herein can be provided in an open cassette or can be provided in a separate station not associated with a cassette. Moreover, in different arrangements, the mechanism for separating the wafer from the support plate during unloading, or for joining the wafer to the support plate during loading, can take on different configurations. All such modifications and changes are intended to fall within the scope of the invention, as defined by the appended claims.

I claim:

1. A susceptor plate wherein the susceptor plate is configured to be removably accommodated horizontally in a susceptor plate holder, the holder having a plurality of slots for accommodating a plurality of vertically spaced susceptor plates and supporting the susceptor plates at edge portions thereof, the susceptor plate configured to accommodate only a single semiconductor wafer of 300 mm diameter or more on an upper support surface during high temperature treatment such that the semiconductor wafer is supported over substantially its entire surface area, and held substantially flat during treatment at an elevated temperature.

2. The susceptor plate of claim 1, wherein the support surface, when loaded with a wafer, shows a deflection of less than 328 µm.

3. The susceptor plate of claim 2, wherein the support surface, when loaded with a wafer, shows a deflection of less than 200 µm.

4. The susceptor plate of claim 3, wherein the support surface, when loaded with a wafer, shows a deflection of less than 125 µm.

5. The susceptor plate of claim 4, wherein the support surface, when loaded with a wafer, shows a deflection of less than 75 µm.

6. The susceptor plate of claim 1, wherein the support surface has been grinded or polished to remove any protrusions higher than 0.5 µm.

7. The susceptor plate of claim 1, wherein the support surface has been grinded or polished to remove any protrusions higher than 0.25 µm.

8. The susceptor plate of claim 1, wherein the support surface has been grinded or polished to remove any protrusions higher than 0.15 µm.

9. The susceptor plate of claim 1, wherein the support surface has been grinded or polished to remove any protrusions higher than 0.10 µm.

10. The susceptor plate of claim 1, comprising 3 spaced apart through-holes to facilitate automatic loading of a wafer onto the susceptor plate and unloading of a wafer from the susceptor plate, the through-holes dimensioned such that they do not leave unsupported a circular area of the wafer having a diameter of more than 20 mm.

11. The susceptor plate of claim 10, wherein the through-holes are dimensioned such that they do not leave unsupported a circular area of the wafer having a diameter of more than 10 mm.

12. The susceptor plate of claim 1, wherein the susceptor plate comprises a CVD SiC material, providing a support surface.

13. The susceptor plate of claim 12, wherein in the CVD SiC material is free standing CVD SiC material.

14. The susceptor plate of claim 1, wherein the susceptor plate holder comprises three support columns defining the slots for supporting the support plates at their edges.

15. The susceptor plate of claim 1, wherein the susceptor plate holder is configured for use in a vertical furnace operating at greater than about 1000° C.

16. The susceptor plate of claim 15, wherein the vertical furnace operates at greater than about 1200° C.

17. The susceptor plate of claim 1, being pre-bent in a convex-up direction.

18. The susceptor plate of claim 1, wherein the susceptor plate has a thickness of 2 mm or thinner.

19. A method for heat treating a plurality of silicon wafers at an elevated treatment temperature, the plurality of wafers accommodated horizontally in a holder in a vertically spaced relationship, the method comprising:

heating the wafers to the treatment temperature;
treating the wafers at the treatment temperature;
cooling the wafers after treatment;
supporting each of the wafers over substantially its entire surface area and holding each wafer substantially flat during heating, treating and cooling, wherein:
if the treatment temperature is less than or equal to about 1000° C. each of the wafers demonstrates a deflection of less than about 328 μm,
if the treatment temperature is between about 1000° C. and 1100° C. each of the wafers demonstrates a deflection of less than about 200 μm,
if the treatment temperature is between about 1100° C. and 12000° C. each of the wafers demonstrates a deflection of less than about 125 μm, and
if the treatment temperature is between about 1200° C. and 1300° C. each of the wafers demonstrates a deflection of less than about 75 μm.

20. The method of claim 19, wherein the treatment temperature is greater than about 1000° C.

21. The method of claim 19, wherein the treatment temperature is greater than about 1200° C.

22. The method of claim 19, further comprising loading the wafer onto a susceptor plate and moving the susceptor plate into a reaction chamber.

23. The method of claim 22, further comprising loading a plurality of susceptor plates each with a wafer and transferring the loaded susceptor plates into a susceptor plate holder, wherein treating at the elevated treatment temperature is conducted with the plurality of loaded susceptor plates in the susceptor plate holder.

24. The method of claim 23, wherein the treatment temperature is greater than about 1000° C.

25. The method of claim 22, wherein the susceptor plate has no openings great enough to accommodate a 20 mm circle in a support surface underlying the wafer.

26. The method of claim 22, wherein the support surface is flat enough to have a deflection of no more than about 328 μm.

27. The method of claim 22, wherein the support surface is flat enough to have a deflection of less than 200 μm.

28. The method of claim 22, further comprising grinding or polishing the support surface to remove any protrusions higher than 0.5 μm.

29. The method of claim 22, further comprising grinding or polishing the support surface to remove any protrusions higher than 0.25 μm.

30. The method of claim 22, wherein each of the wafers has a diameter of at least about 300 mm.

* * * * *

UNITED STATES PATENT AND TRADEMARK OFFICE
CERTIFICATE OF CORRECTION

| | | |
|---|---|---|
| PATENT NO. | : 7,256,375 B2 | Page 1 of 1 |
| APPLICATION NO. | : 10/636372 | |
| DATED | : August 14, 2007 | |
| INVENTOR(S) | : Theodor Oosterlaken | |

It is certified that error appears in the above-identified patent and that said Letters Patent is hereby corrected as shown below:

On Title Page 2 Item [56], Col. 2 (Foreign Patent Documents), Line 2, please delete "10-321643" and insert --10-321543--, therefor.

In Item [56], under Foreign Patent Documents, please insert --EP 1615261 A1--, therefor.

In Col. 1, line 15, please delete "2003" and insert --2003.--, therefor.

In Col. 2, line 10, please delete "µm." and insert --µm,--, therefor.

In Col. 2, line 10, delete "height." and insert --height,--, therefor.

In Col. 2, line 11, please delete "µm." and insert --µm,--, therefor.

In Col. 6, line 64, please delete "grounded" and insert --ground--, therefor.

In Col. 7, line 38, please delete "$b^{A-A}=50$" and insert --$b_{A-A}=50$--, therefor.

In Col. 11, line 14, Claim 19, please delete "12000°" and insert --1200°--, therefor.

Signed and Sealed this

Eighteenth Day of March, 2008

JON W. DUDAS
*Director of the United States Patent and Trademark Office*